US010734257B2

(12) United States Patent
Serebryanov et al.

(10) Patent No.: US 10,734,257 B2
(45) Date of Patent: Aug. 4, 2020

(54) DIRECT CURRENT LAMP DRIVER FOR SUBSTRATE PROCESSING

(71) Applicant: APPLIED MATERIALS, INC., Santa Clara, CA (US)

(72) Inventors: Oleg Serebryanov, San Jose, CA (US); Joseph M. Ranish, San Jose, CA (US); Alexander Goldin, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1266 days.

(21) Appl. No.: 13/866,505

(22) Filed: Apr. 19, 2013

(65) Prior Publication Data

US 2013/0287377 A1  Oct. 31, 2013

Related U.S. Application Data

(60) Provisional application No. 61/638,193, filed on Apr. 25, 2012, provisional application No. 61/707,488, filed on Sep. 28, 2012.

(51) Int. Cl.
*H01L 21/67* (2006.01)

(52) U.S. Cl.
CPC .............................. *H01L 21/67115* (2013.01)

(58) Field of Classification Search
CPC .............. H01L 21/67; H01L 21/67115; H01L 21/67248; H01L 21/67109; H01L 21/324; F24C 15/00
USPC ........ 392/407, 411, 416, 390, 483, 486, 501
See application file for complete search history.

(56) References Cited

U.S. PATENT DOCUMENTS

| 4,873,620 | A   | * | 10/1989 | Neulinger et al. ............... 363/57 |
| 5,155,336 | A   |   | 10/1992 | Gronet et al. |
| 6,580,059 | B1  |   | 6/2003  | Kanno |
| 6,818,894 | B2  | * | 11/2004 | Takoudis et al. ........ 250/339.08 |
| 6,984,205 | B2  | * | 1/2006  | Gazdzinski .................... 600/160 |
| 7,283,734 | B2  |   | 10/2007 | Kubo |
| 7,923,933 | B2  | * | 4/2011  | Serebryanov et al. ......... 315/90 |
| 8,629,572 | B1  | * | 1/2014  | Phillips .......................... 290/53 |

(Continued)

FOREIGN PATENT DOCUMENTS

JP          2001110737  A  *  4/2001

OTHER PUBLICATIONS

International Search Report and Written Opinion dated Jul. 26, 2013 for PCT Application No. PCT/US2013/037521.

*Primary Examiner* — Eric S Stapleton
(74) *Attorney, Agent, or Firm* — Moser Taboada; Alan Taboada

(57) ABSTRACT

Methods and apparatus for heating a substrate in a process chamber are provided herein. In some embodiments, an apparatus for heating a substrate in a process chamber includes a lamp group comprising one or more sets of lamps to provide radiant energy to heat a substrate when disposed in the process chamber, wherein each set of lamps comprises a plurality of lamps wired in series, and wherein each set of lamps is wired in parallel with respect to other sets of the one or more sets of lamps; an alternating current (AC) power source to produce an AC input waveform; and a lamp driver to power the lamp group, the lamp driver including a rectifier coupled to the AC power source to convert the AC input waveform to DC voltage; and a direct current to direct current (DC/DC) converter to reduce voltage of the DC power.

16 Claims, 6 Drawing Sheets

(56) References Cited

U.S. PATENT DOCUMENTS

| | | | |
|---|---|---|---|
| 8,693,584 B1* | 4/2014 | Sternowski | 375/340 |
| 2003/0029859 A1* | 2/2003 | Knoot et al. | 219/483 |
| 2005/0029993 A1* | 2/2005 | Hadizad | 323/223 |
| 2005/0179354 A1* | 8/2005 | Camm et al. | 313/231.51 |
| 2006/0051077 A1* | 3/2006 | Kubo | 392/416 |
| 2008/0187299 A1* | 8/2008 | Shimizu | H01L 21/67115 392/418 |
| 2009/0214193 A1* | 8/2009 | Suzuki et al. | 392/411 |
| 2010/0308729 A1* | 12/2010 | Ramachandran et al. | 315/73 |
| 2011/0067260 A1* | 3/2011 | Kim et al. | 34/201 |
| 2011/0121752 A1* | 5/2011 | Newman et al. | 315/291 |
| 2011/0206358 A1* | 8/2011 | Goldin et al. | 392/411 |
| 2011/0255848 A1* | 10/2011 | Ji et al. | 392/411 |
| 2014/0265824 A1* | 9/2014 | Ranish | 313/578 |
| 2015/0078045 A1* | 3/2015 | Zhang et al. | 363/64 |

* cited by examiner

DIRECT CURRENT LAMP DRIVER FOR SUBSTRATE PROCESSING

CROSS-REFERENCE TO RELATED APPLICATIONS

This application claims benefit of U.S. provisional patent application Ser. No. 61/638,193, filed Apr. 25, 2012, and U.S. provisional patent application Ser. No. 61/707,488, filed Sep. 28, 2012, which are herein incorporated by reference in their entireties.

FIELD

Embodiments of the present invention generally relate to methods and apparatus for thermal processing of substrates.

BACKGROUND

Rapid Thermal Processing (RTP) is a semiconductor manufacturing process for heating silicon wafers at high temperatures, often 1200 degrees Celsius or greater, in a relatively short period of time, for example, in several seconds or less. During cooling in an RTP tool, wafer temperatures must be brought down evenly so as not to subject the wafer to thermal shock. This heating is often achieved using high intensity lamps, or lasers. Controlling the wafer temperature is a key challenge in rapid thermal processing. Often, this is achieved by monitoring the temperature of the wafer and using pyrometry to control, in real-time, the power and intensity of the lamps. An array of pyrometers may be used to measure the temperature of a wafer and based on that temperature, output voltage of a driver for the lamps is determined. Thus, an RTP tool for rapid thermal processing of wafers often comprises an array of lamps for heating a wafer, a chamber containing the wafer, a support for the wafer, and an array of pyrometers for measuring wafer temperature coupled to the wafer or the support for the wafer.

Therefore, the inventors have provided an improved lamp driver and substrate processing tools incorporating same.

SUMMARY

Methods and apparatus for heating a substrate in a process chamber are provided herein. In some embodiments, an apparatus for heating a substrate in a process chamber includes a lamp group comprising one or more sets of lamps to provide radiant energy to heat a substrate when disposed in the process chamber, wherein each set of lamps comprises a plurality of lamps wired in series, and wherein each set of lamps is wired in parallel with respect to other sets of the one or more sets of lamps; an alternating current (AC) power source to produce an AC input waveform; and a lamp driver to power the lamp group, the lamp driver including a rectifier coupled to the AC power source to convert the AC input waveform to DC voltage; and a direct current to direct current (DC/DC) converter to reduce voltage of the DC power.

In some embodiments, a method for heating a substrate in a process chamber includes converting an alternating current (AC) power source voltage into a direct current (DC) power source voltage; powering a driver as a load using the DC voltage; and powering one or more lamp groups each comprising one or more sets of lamps to provide radiant energy to heat the substrate in the process chamber, wherein each set of lamps comprises a plurality of lamps wired in series, and wherein each set of lamps is wired in parallel with respect to other sets of the one or more sets of lamps.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
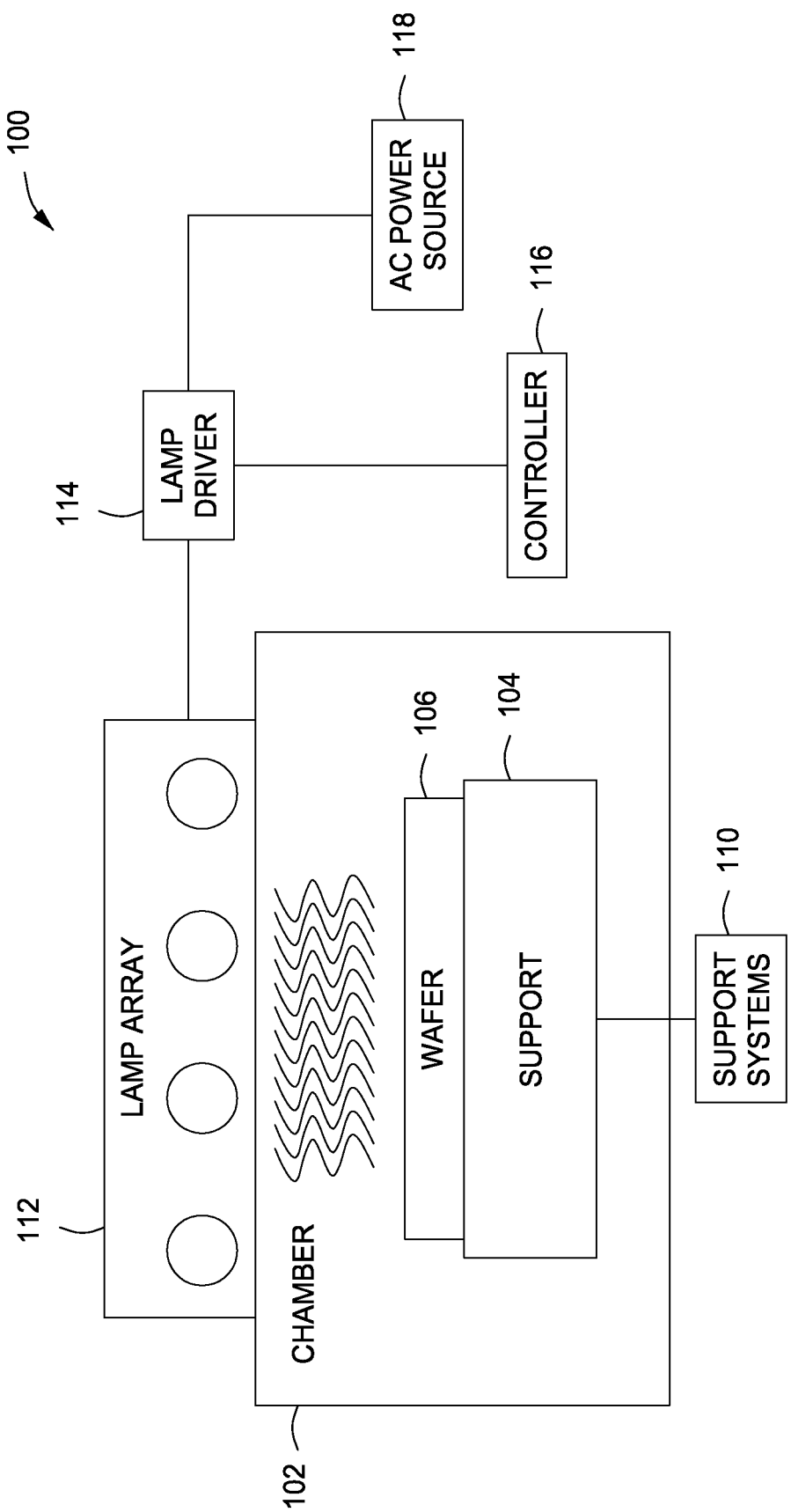
FIG. 1 depicts a block diagram of a substrate processing apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of some embodiments may be beneficially incorporated in other embodiments without further recitation.

DETAILED DESCRIPTION

Embodiments of the present invention are directed to methods and apparatus for powering an array of lamps to heat a substrate in various thermal processes, such as rapid thermal processing (RTP), chemical vapor deposition (e.g., epitaxial deposition), or other substrate processes that use lamps for heating. The substrate processing tool used for the thermal processing is powered by an AC power source, which is, in some embodiments, 480V. A rectifier is used to convert the AC power source to a direct current (DC) power source. A DC to DC converter is used to step down the voltage to power an array of lamps and lamp groups.

High power lamp heaters used on new generation of semiconductor equipment will require prohibitive amount of current if supplied by 208 VAC. Examples of lamps include incandescent lamps, such as halogen or tungsten halogen incandescent lamps, or the like. The configuration of the lamp driver can vary dependent upon the type of lamp used. For example, typically, 100V halogen lamps are used in lamp heaters for semiconductor equipment. Two lamps disposed in series allow the use of a phase angle control based lamp driver and a 208V AC power line. However, use of a higher voltage power line, for example 480V AC, is not feasible for the same type of halogen lamps for at least two reasons. First, a configuration with two lamps connected in series yields low accuracy of phase angle control and poor power factor of the system which is unacceptable due to low duty cycle of the phase angle controlled driver. In addition, connecting more than two lamps in series to increase the phase angle control accuracy and improve power factor is not feasible because it decreases the granularity of the heating pattern, disables functionality of the lamp fuse by limiting fuse current, and increases risk of arcing in a low pressure atmosphere.

However, a problem exists that in this design an output voltage of 200V cannot be exceeded, such that only two about 80-120V, or about 100V, lamps can be connected in series. Another problem is that there are limitations on the current that may be provided to the semiconductor equipment, such as a Rapid Thermal Processing (RTP) tool or other thermal processing tool that uses or can use lamps similar to as described herein. In this scheme, adding more lamps to the lamp array for thermal processing is not feasible, as current limits will be exceeded. For example, the power source for an RTP tool is often a multiple phase alternating current (A/C) power source. However, transformer losses, excessive harmonics, and the like are generated when the current across the three phases is imbalanced.

FIG. 1 depicts a block diagram of a substrate processing apparatus 100 in accordance with embodiments of the present invention. Although the specific configuration of the substrate processing apparatus 100 shown in FIG. 1 is suitable for RTP, it is contemplated that the substrate processing apparatus 100 may be configured for epitaxial deposition or other thermal substrate processes. As depicted in FIG. 1, the substrate processing apparatus 100 comprises a chamber 102, a support 104 for a substrate 106, support systems 110, lamp array 112, lamp driver 114, controller 116, an AC power source 118 and, optionally, a polarity switch 119. The substrate 106 is, for example, a semiconductor wafer. The support 104 holds the substrate 106 so that it may be thermally processed in the chamber 102. The support systems 110 control the support and allow for adjustment of the support 104 position, and in turn, the position of the substrate 106.

The AC power source 118 delivers AC power to the lamp driver 114. The AC power may have one or more phases, and in some embodiments, has three phases. In some embodiments, the AC power source delivers 480V to the lamp driver 114. The controller 116 controls the operation of the lamp driver 114. The lamp driver 114 transforms the AC power to DC power and steps down the DC power voltage. The lamp driver 114 distributes the stepped-down power to the lamp array 112. In turn, the lamp array 112 produces heat to thermally process the substrate 106 within the chamber 102. In some embodiments, the lamp array 112 comprises several about 80V to about 120V, such as about 100V, lamps, such as halogen lamps, and the stepped-down voltage is 200V. In other embodiments, other types of lamps with different power constraints may be used, such as incandescent lamps having other voltage ratings, or the like.

The polarity switch 119, when present, is coupled to the lamp driver 114 and the lamp array 112, and allows for toggling the polarity of the circuit. According to some embodiments, the polarity switch 119 reverses the polarity of the substrate processing apparatus 100 for every n wafers transferred into the chamber 102, where n=1 to a about 100 wafers. For example, the polarity may be reversed after every wafer, or after a number of wafers in a single cassette (for example about 25), or greater numbers, such as after processing about 100 wafers. Switching the polarity of the circuit may facilitate mitigating DC notching, or faceting, of the filament of the lamp, which would lead to failure of the lamp.

Figure 2:
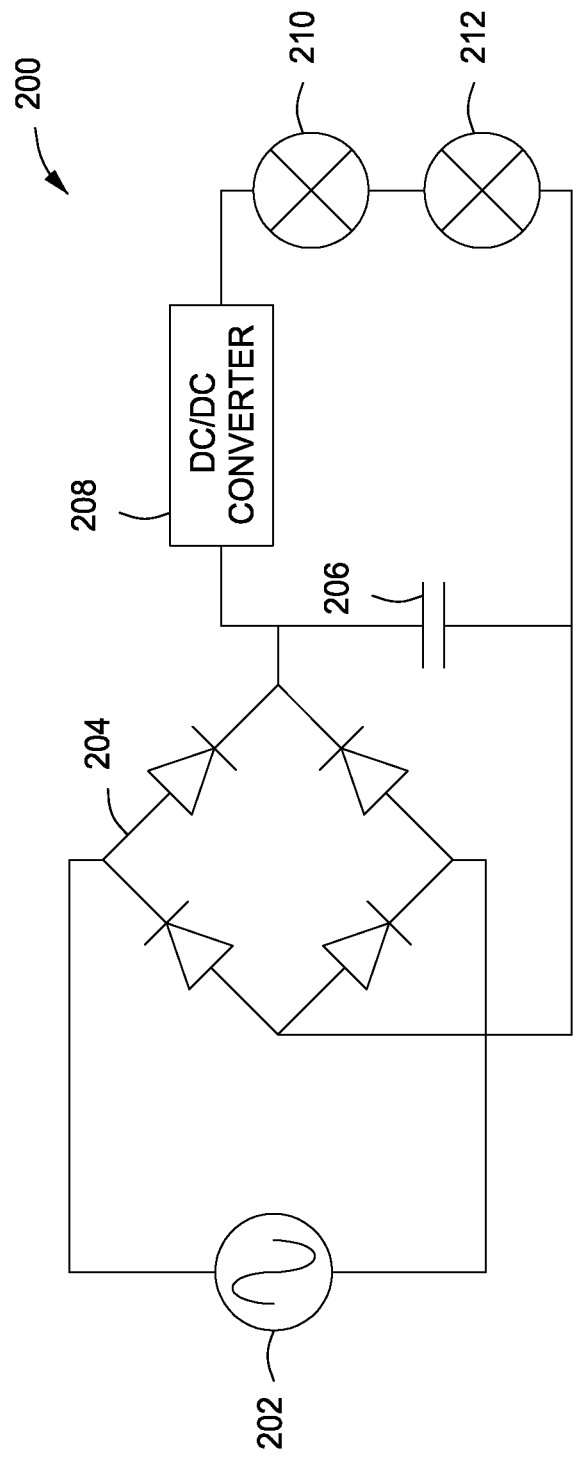
FIG. 2 depicts a circuit diagram of a substrate processing apparatus in accordance with some embodiments of the present invention.

FIG. 2 depicts a circuit diagram of a substrate processing apparatus 200 in accordance with embodiments of the present invention. The substrate processing apparatus 200 comprises an AC power source 202, a rectifier 204, a capacitor 206, a DC to DC converter 208 and two lamps 210 and 212. The AC power source 202 delivers AC power to the rectifier 204. The rectifier 204 converts the AC voltage from the AC power source 202 to DC voltage, i.e., it "rectifies" the AC voltage to DC voltage. In some embodiments, the AC power source is a 480V power source and the rectifier 204 rectifies the AC 480V to DC 700V. Together, the rectifier 204, the capacitor 206 and the DC to DC converter 208 form the lamp driver 114 shown in FIG. 1. As mentioned above, in some embodiments, the lamps 210 and 212 may be halogen lamps, such as tungsten-halogen incandescent lamps. In addition, the lamps are coupled in series in this embodiment.

Figure 3:
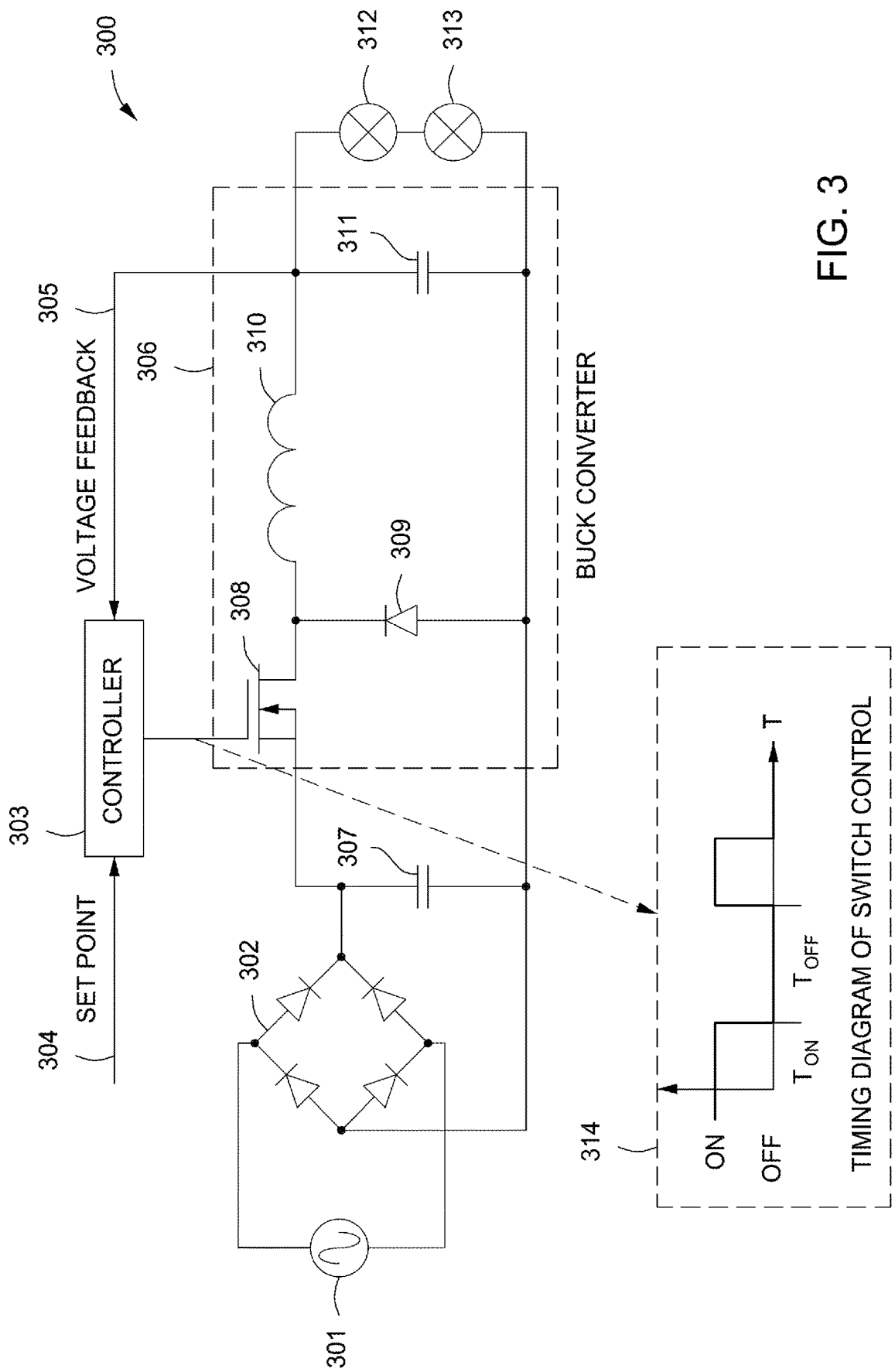
FIG. 3 depicts a circuit diagram of a substrate processing apparatus implemented with a Buck converter in accordance with some embodiments of the present invention.

FIG. 3 depicts a circuit diagram of a substrate processing apparatus 300 using a Buck Converter in accordance with embodiments of the present invention. The substrate processing apparatus 300 comprises an AC voltage source 301, a rectifier 302, a controller 303, a Buck converter 306, a capacitor 307 and lamps 312 and 313. The rectifier 302 converts the AC voltage from the AC power source 202 to DC voltage, i.e., it "rectifies" the AC voltage to DC voltage. The rectifier 302 produces a DC signal According to some embodiments, the capacitor 311 acts as a filter capacitor for filtering the rectified voltage from the AC voltage source 301. In this embodiment, the DC to DC converter 208 is a buck converter, which is a step-down DC to DC converter. Buck converters have high efficiency and efficiently convert the 700V DC to 200V DC required by the lamps 210 and 212.

The Buck converter 306 consists of a switch 308, an inductor 310, a diode 309, and a capacitor 311. The controller 303 receives a set point signal 304 which the controller 303 compares with an actual output voltage 305 to form the control signal to the Buck converter 306. By changing the ratio between $T_{on}$ and $T_{off}$ time according to the timing diagram 314, the controller 303 controls the output voltage on the output of the Buck converter 306. When the switch 308 is closed (on state), the voltage across the inductor 310 is equal to the difference between the voltage from 301 and the voltage across lamps 312 and 313. The current through the inductor 310 rises linearly. As the diode 309 is reverse-biased by the voltage source 301, no current flows through it. When the switch 308 is opened (off state), the diode 309 is forward biased. The voltage across the inductor is equal to the negative of the voltage across the lamps 312 and 313 (neglecting diode drop). The current across the inductor 310 decreases.

Figure 4:
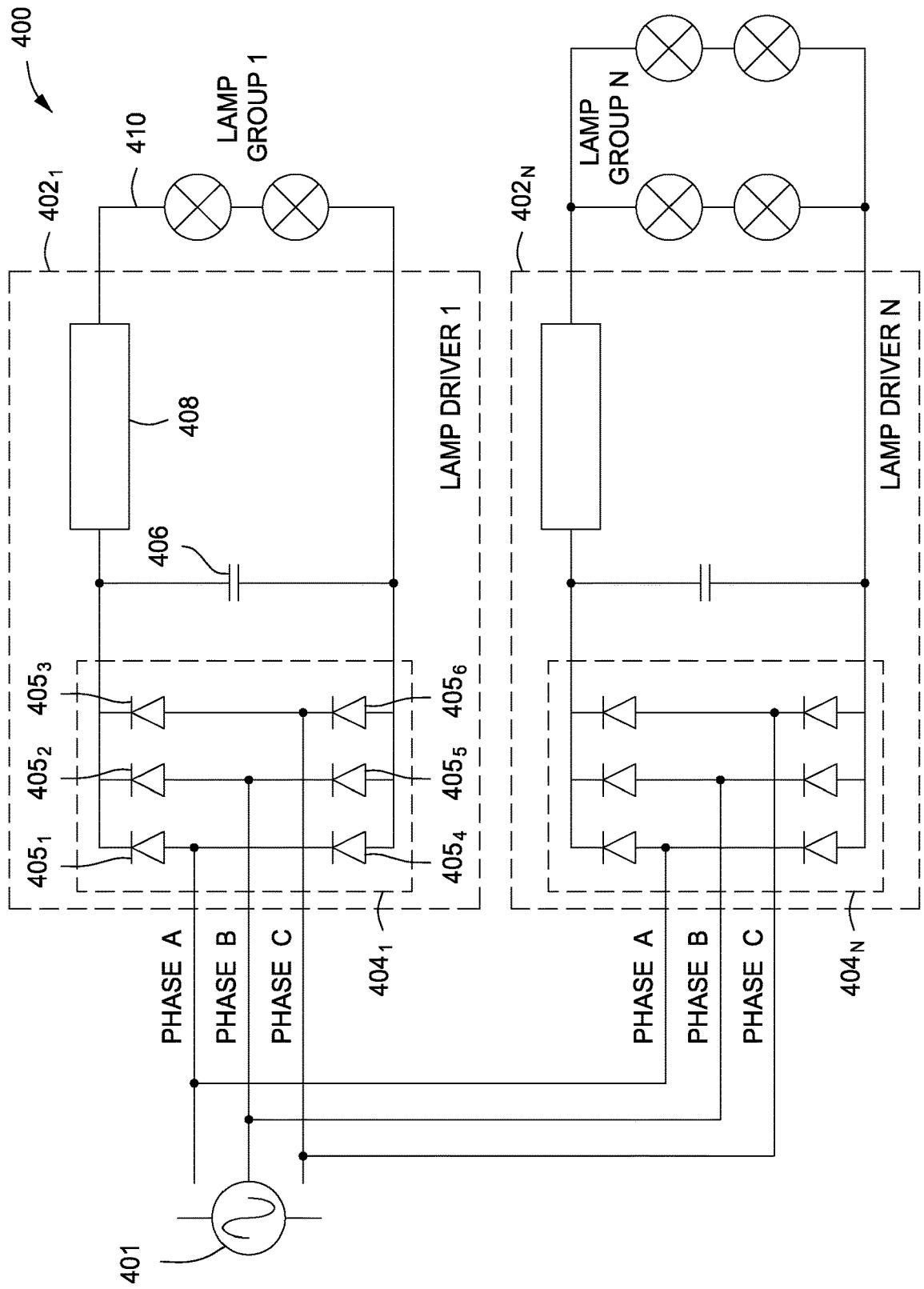
FIG. 4 depicts a circuit diagram of a substrate processing apparatus in accordance with some embodiments of the present invention.

FIG. 4 depicts a circuit diagram of a substrate processing apparatus 400 in accordance with some embodiments of the present invention. In contrast to FIG. 2, substrate processing apparatus 400 comprises a plurality of lamp drivers $402_1$ to $402_n$ to drive a plurality of lamp groups (e.g., having multiple channels). A single AC power source 401 is coupled to each lamp driver. The lamp driver $402_1$ comprises a rectifier $404_1$ which converts AC power into DC power, as described above with regard to rectifier 204. In the embodiment shown, the rectifier $404_1$ is a three-phase rectifier for converting AC power to DC power. In the embodiment shown, the rectifier $404_1$ comprises diodes $405_1$ to $405_6$ coupled together. Diode $405_1$ and diode $405_4$ are connected in series with each other, diodes $405_2$ and $405_5$ are connected in series with each other and diodes $405_3$ and $405_6$ are connected in series with each other, respectively. The serially connected diode pairs are then coupled in parallel with respect to each other pair and with a capacitor 406 for filtering the DC voltage rectified by the rectifier $404_1$.

The rectified DC voltage is stepped down to the requisite level of DC voltage by the DC to DC converter 408. The stepped down DC voltage powers the coupled lamp group 410, which, in the embodiment shown, comprises two lamps coupled in series. In other configurations, the lamp group can include multiple pairs of lamps, each pair connected in series, and the multiple pairs connected in parallel to each other, as in lamp driver 402n. In lamp driver 402n, there is an increased load requirement due to the increased number of lamps in the lamp group, yet the current across the phases remains balanced. Therefore, in this configuration, current remains balanced regardless of lamp driver lines having different loads and the voltage is adjusted as required.

In some embodiments, each lamp driver $402_1$ . . . $402_n$ may share certain components, such as the rectifier, and the filter capacitor. Each channel retains support of a similar or varying load of lamp groups. Each channel of the plurality of channels retains control with independent voltage outputs to the lamp groups.

Figure 5:
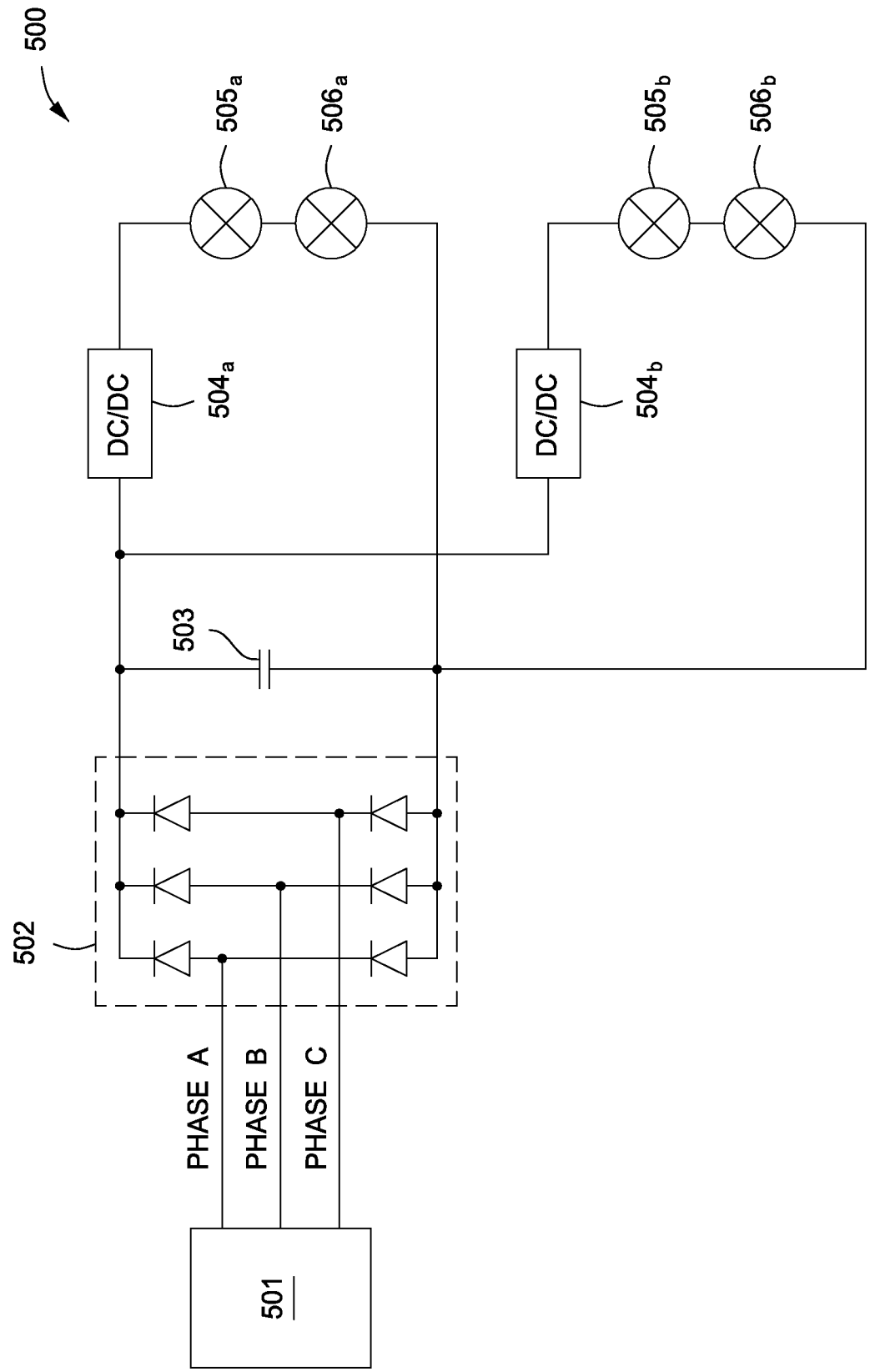
FIG. 5 depicts a circuit diagram of a substrate processing apparatus in accordance with some embodiments of the present invention.

For example, FIG. 5 depicts a circuit diagram of a substrate processing apparatus 500 with lamp driver channels having shared components in accordance with embodiments of the present invention. The substrate processing apparatus 500 comprises a power source 501, a rectifier 502, a filter capacitor 503, a first DC/DC converter 504a and a second DC/DC converter 504b, and lamps 505a, 505b, 506a and 506b. In this embodiment, source 501 provides a three phase (A/B/C in FIG. 5) voltage to distinct portions of the rectifier 502. The rectifier 502 and filter capacitor 503 are coupled to independently controlled lamp groups, where the first lamp group includes lamps 505a and 506a, and the second lamp group includes 505b and 506b. Therefore, in this embodiment, one rectifier 502 and one filter capacitor 503 is shared amongst several lamp groups. In other embodiments, more than two lamp groups are supported.

Figure 6:
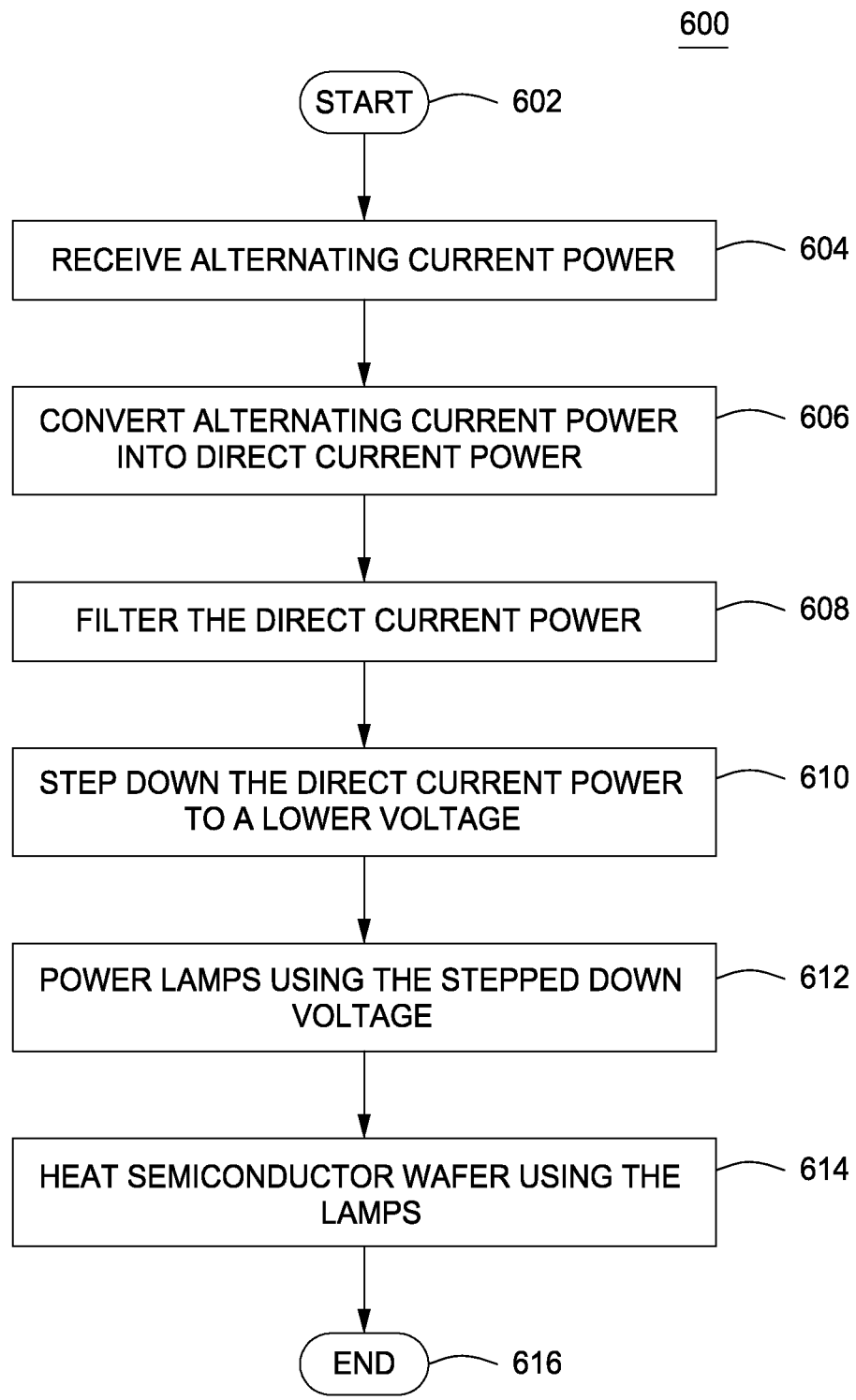
FIG. 6 depicts a flow diagram of a method for powering an array of lamps for processing a substrate in accordance with some embodiments of the present invention.

FIG. 6 depicts a flow diagram of a method 600 for powering an array of lamps for use in substrate processing in accordance with embodiments of the present invention. The method begins at 602 and proceeds to 604. At 604, the circuit receives AC power from the AC power source (e.g., AC power source 401 as shown in FIG. 4). As discussed above, the AC power source, in some embodiments, is a 480V source.

At 606, the AC power is converted into DC power. For example, the rectifier $404_1$ of FIG. 4 converts the AC power into DC power. For example, the aforementioned 480V power may be converted to 650V DC. At 608, the DC power may be conditioned, or smoothed, so that there are no voltage spikes, or hiccups in power delivery to the lamp groups. For example, the filter capacitor 406 may smooth the DC power.

At 610, a DC to DC converter steps down the voltage to a voltage required for the lamp group. For example, the voltage may be stepped down to the 200V powering lamp group 410 as shown in FIG. 4. The step-down converter is, in some embodiments, a buck converter, as described above. At 612, the stepped down voltage is delivered to power the lamps. The lamps may be several lamp groups, such as lamp group 410 with various configurations of lamps and various voltage requirements. At 614, the heat from the lamps heats the substrate, for example, a semiconductor wafer.

Optionally, the method 600 may iterate one or more times during processing to control the energy provided by the lamps to achieve a desired process result. For example, the method 600 may iterate between 610 and 614 to step down the voltage to a desired or setpoint voltage, to deliver the desired or setpoint voltage to power the lamps, and to heat the substrate with the energy provided by the lamps. This iteration may continue one or more times to achieve a desired process result. The method 600 generally ends at 616.

While the foregoing is directed to embodiments of the present invention, other and further embodiments of the invention may be devised without departing from the basic scope thereof.

The invention claimed is:

1. An apparatus for heating a substrate in a process chamber, comprising:
   a plurality of lamp groups, each of the plurality of lamp groups comprising one or more sets of lamps to provide radiant energy to heat a substrate when disposed in the process chamber, wherein each set of lamps comprises a plurality of lamps, all of the plurality of lamps being wired in series within the each set of lamps, and wherein the each set of lamps is wired in parallel with respect to other sets of lamps within the one or more sets of lamps;
   a plurality of DC to DC converters, coupled to each of the plurality of lamp groups, to step down voltage to the each of the plurality of lamp groups;
   a three-phase alternating current (AC) power source to produce a three-phase AC input voltage;
   a lamp driver, coupled to the three-phase AC power source and to all of the plurality of lamp groups, to control the plurality of lamp groups, each lamp driver comprising a rectifier, coupled to the AC power source to convert the three-phase AC input voltage to DC voltage; and
   a filter capacitor, coupled to the lamp driver and all of the plurality of lamp groups, that filters the DC voltage from the rectifier.

2. The apparatus of claim 1, wherein the rectifier has three phase inputs and current is balanced across each phase.

3. The apparatus of claim 1, wherein the rectifier comprises:
   three diode pairs, each diode in a diode pair connected serially, and each pair connected in parallel with each other pair to produce the DC voltage; and
   a capacitor, connected to the diode pairs in parallel, to smooth the DC voltage.

4. The apparatus of claim 1, wherein the rectifier further comprises:
   a diode bridge of a first and second diode pairs, wherein a first and second diode in each pair are connected in series, and the first and second diode pairs are connected in parallel, to produce the DC voltage; and
   a capacitor, connected to the first and second diode pair in parallel, to smooth the DC voltage.

5. The apparatus of claim 4, wherein the capacitor is a filter capacitor.

6. The apparatus of claim 1, wherein one or more of the plurality of DC/DC converters is a buck converter.

7. The apparatus of claim 1, wherein the rectifier is a passive bridge rectifier or a switch-mode active rectifier.

8. The apparatus of claim 1, further comprising a polarity switch coupled to the lamp driver to reverse a polarity of the lamp driver.

9. The apparatus of claim 1, wherein the one or more sets of lamps comprise a first and second lamp of about 80 to about 120 volts each connected in series.

10. The apparatus of claim 1, wherein the AC voltage is about 480 volts.

11. The apparatus of claim 1, further comprising:
a substrate support disposed in the process chamber, wherein the lamp group is configured to provide radiant energy to a support surface of the substrate support.

12. The apparatus of claim 1, wherein a single rectifier and the filter capacitor are shared amongst several lamp groups among the plurality of lamp groups.

13. A method for heating a substrate in a process chamber, comprising:
converting a three-phase alternating current (AC) power source voltage into a direct current (DC) power source voltage;
powering a lamp driver as a load using the DC voltage; and
powering a plurality of lamp groups each comprising one or more sets of lamps to provide radiant energy to heat the substrate in the process chamber, wherein each set of lamps comprises a plurality of lamps, all of the plurality of lamps being wired in series within the each set of lamps, and wherein each set of lamps is wired in parallel with respect to other sets of lamps within the one or more sets of lamps and wherein the lamp driver controls all of the plurality of lamp groups.

14. The method of claim 13, wherein the converting further comprises smoothing the DC voltage using a capacitor, the capacitor being shared across all of the plurality of lamp groups.

15. The method of claim 13, wherein the converting further comprises balancing current across each phase of the AC power source.

16. The method of claim 13, wherein the AC power source provides about 480 volts.

* * * * *